(12) United States Patent
Sung et al.

(10) Patent No.: US 8,211,614 B2
(45) Date of Patent: Jul. 3, 2012

(54) PHOTORESIST COMPOSITION AND PATTERNING METHOD THEREOF

(75) Inventors: Shi-Jin Sung, Jeollabuk-do (KR); Sang-Haeng Lee, Jeollabuk-do (KR); Sang-Tae Kim, Jeollabuk-do (KR)

(73) Assignee: Dongwoo Fine-Chem. Co., Ltd., Seoul (KR)

( * ) Notice: Subject to any disclaimer, the term of this patent is extended or adjusted under 35 U.S.C. 154(b) by 331 days.

(21) Appl. No.: 12/376,107

(22) PCT Filed: Aug. 2, 2007

(86) PCT No.: PCT/KR2007/003726
§ 371 (c)(1),
(2), (4) Date: Feb. 2, 2009

(87) PCT Pub. No.: WO2008/016270
PCT Pub. Date: Feb. 7, 2008

(65) Prior Publication Data
US 2010/0203444 A1    Aug. 12, 2010

(30) Foreign Application Priority Data
Aug. 4, 2006 (KR) .................. 10-2006-0073900

(51) Int. Cl.
G03F 7/004 (2006.01)
G03F 7/30 (2006.01)

(52) U.S. Cl. ............... 430/270.1; 430/191; 430/192; 430/193; 430/326

(58) Field of Classification Search ............... 430/191, 430/192, 193, 270.1, 326
See application file for complete search history.

(56) References Cited

U.S. PATENT DOCUMENTS

| | | | | |
|---|---|---|---|---|
| 4,123,279 A | * | 10/1978 | Kobayashi | 430/193 |
| 4,797,346 A | * | 1/1989 | Yamamoto et al. | 430/192 |
| 5,178,986 A | * | 1/1993 | Zampini et al. | 430/190 |
| 5,932,396 A | * | 8/1999 | Kamijima | 430/320 |
| 6,746,812 B2 | * | 6/2004 | Watanabe et al. | 430/165 |

(Continued)

FOREIGN PATENT DOCUMENTS

JP          05-113666          5/1993

(Continued)

OTHER PUBLICATIONS

Related Japanese Office Action (mailed Nov. 24 2010), English translation provided.

(Continued)

*Primary Examiner* — John Chu
(74) *Attorney, Agent, or Firm* — Baker & Hostetler LLP

(57) ABSTRACT

Disclosed is a resist composition which has desirable physical properties such as sensitivity, resolution, residual film ratio and coating property, and forms a pattern having the desirable profile and depth of focus due to excellent light transmissivity during a semiconductor process and a flat panel display process using a short wavelength of 248 nm (KrF) or less, even though the resist composition is applied to a non-chemically amplified resist. The photoresist composition comprises a novolac-based resin A, a photosensitizer B, and a low molecular substance C having low absorbance. The low molecular substance having low absorbance has absorbance that is lower than absorbance of the novolac-based resin at one or more wavelengths of 248 nm, 193 nm, and 157 nm, and the photoresist composition is used at the wavelength of 248 nm or less.

6 Claims, 4 Drawing Sheets

U.S. PATENT DOCUMENTS

| | | | |
|---|---|---|---|
| 7,803,510 B2 * | 9/2010 | Naiini et al. | 430/190 |
| 2003/0073034 A1 * | 4/2003 | Tan et al. | 430/278.1 |
| 2005/0084793 A1 | 4/2005 | Yueh et al. | |
| 2005/0286031 A1 | 12/2005 | French et al. | |

FOREIGN PATENT DOCUMENTS

| | | |
|---|---|---|
| JP | 1996-179502 A | 1/1998 |
| JP | 2000-298349 | 10/2000 |
| JP | 2001-142217 A | 5/2001 |
| JP | 16258099 A | 9/2004 |
| JP | 17114920 | 4/2005 |
| JP | 2005-316412 A | 11/2005 |
| WO | 0034829 A1 | 6/2000 |
| WO | 2004088424 A2 | 10/2004 |
| WO | 2005007719 A2 | 1/2005 |

OTHER PUBLICATIONS

Office Action and Search Report from related TW Application No. 096128656 (Original and English Translation), Dated Apr. 14, 2011.

* cited by examiner

[Fig. 1]
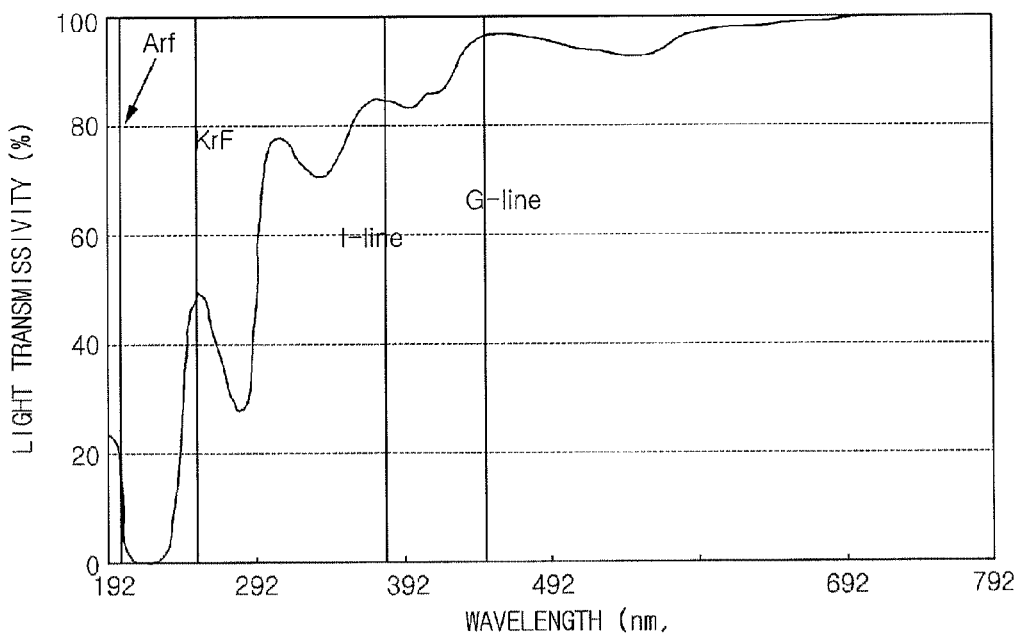
[Fig. 2]
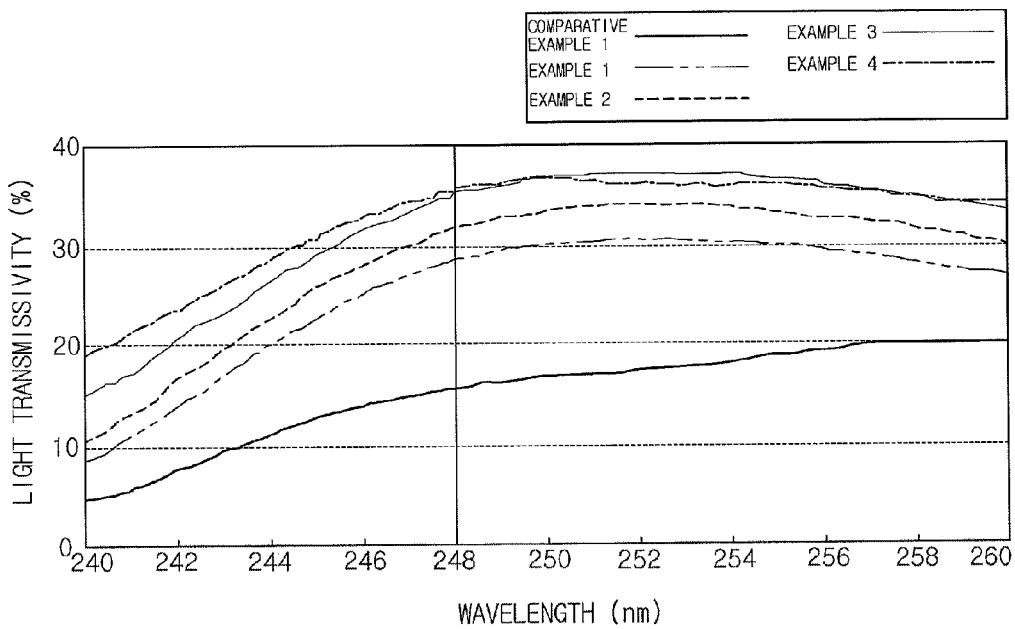

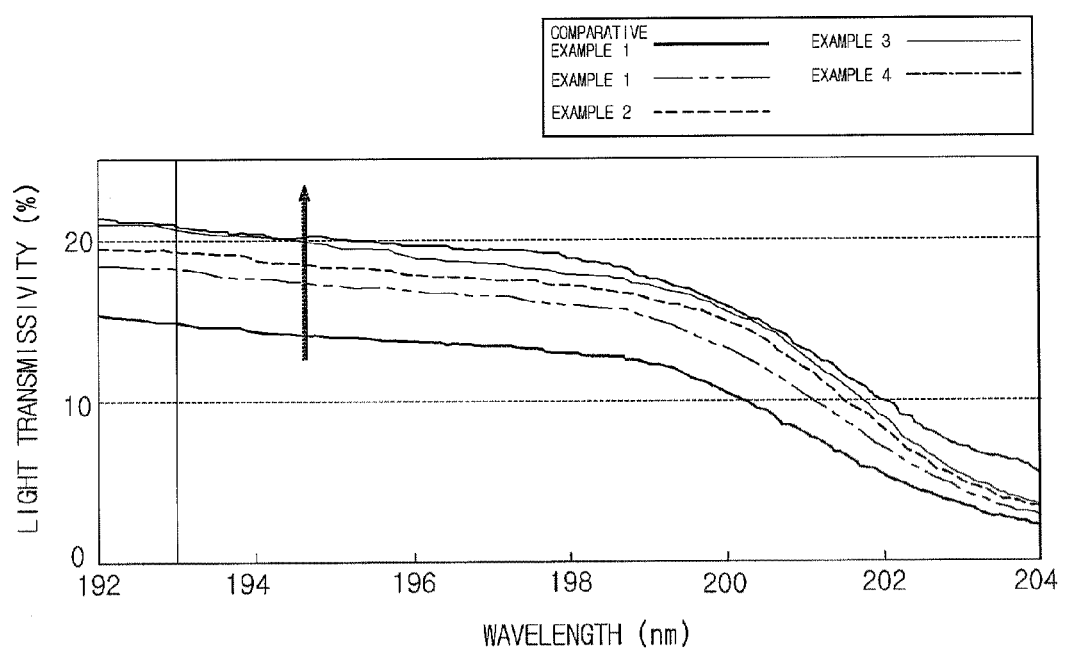
[Fig. 3]

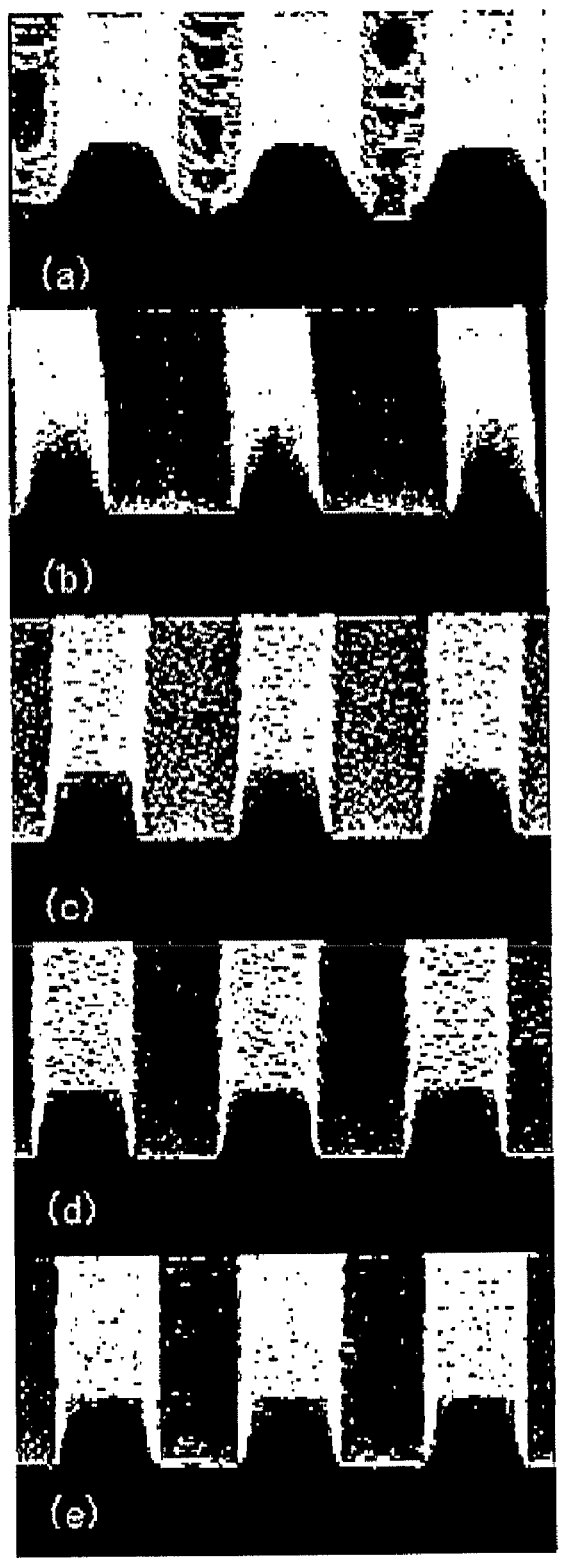
[Fig. 4]

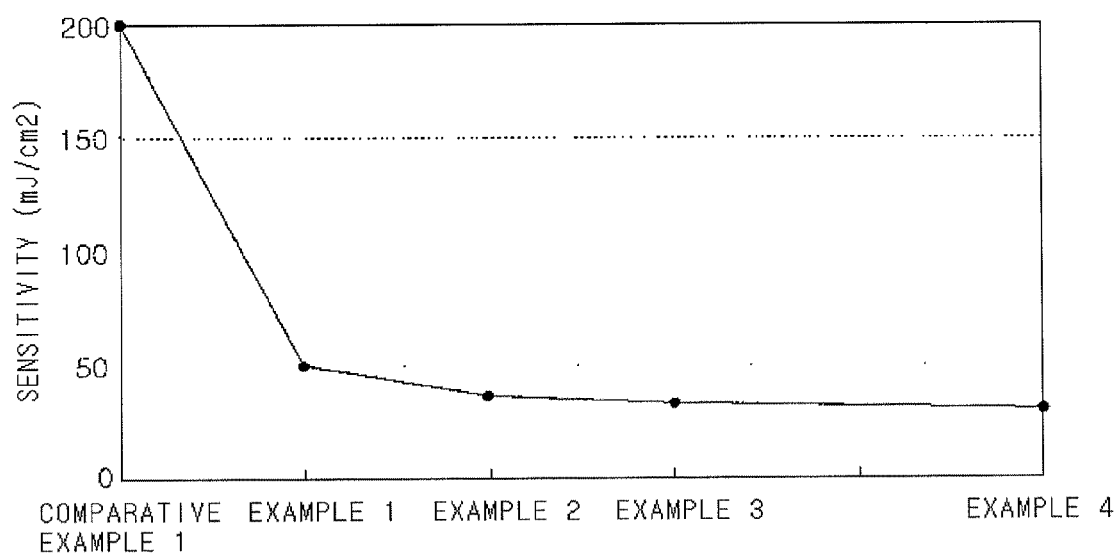
[Fig. 5]

PHOTORESIST COMPOSITION AND PATTERNING METHOD THEREOF

TECHNICAL FIELD

The present invention relates to a photoresist composition that is capable of being used to form a fine pattern on a semiconductor and a flat panel display by using a short wavelength of KrF (248 nm) or less and a method of forming a pattern thereof.

This application claims priority from Korea Patent Application Nos. 10-2006-0073900 filed on Aug. 4, 2006 in the KIPO, the disclosure of which is incorporated herein by reference in its entirety.

BACKGROUND ART

Generally, microprocessing is performed during a lithography process using a resist composition while semiconductors are manufactured. In the lithography process, a resolution may be improved by reducing the wavelength as shown in Rayleigh Equation in respects to a diffraction limit. Therefore, the wavelength of the light source for lithography process that is used to manufacture semiconductors has been reduced in the order of g-line (wavelength 436 nm), i-line (wavelength 365 nm), KrF-excimer laser (wavelength 248 nm), and ArF-excimer laser (wavelength 193 nm).

In recent years, the integration of integrated circuits has increased, accordingly, the demand for the submicron pattern has also increased. In particular, a photolithography process that uses a KrF-excimer laser or an ArF-excimer laser is noticed because 64-M to 1G DRAMs can be manufactured by using the photolithography process. Meanwhile, color filters are also used with photoresists and require micropatterns. However, a lens of an exposing device using an excimer laser having a short wavelength has a shorter lifespan as compared to a known lens that is used as a light source for exposure. Thus, it is preferable to expose the lens to the excimer laser over a short period of time.

In the related art, a novolac-based resin is the main component of a photoresist composition, which can be used to perform an exposure process by using g-lines (436 nm) and i-lines (365 nm).

According to the Lambert-Beer law, the absorbance is in proportion to a transmission length and a concentration of species absorbing light. Thus, if the concentration of species absorbing light is reduced, the total absorbance is reduced and the transmissivity of the photoresist is increased.

FIG. 1 is a graph illustrating light transmissivity according to a wavelength of a known non-chemically amplified photoresist that contains a novolac-based resin and a photosensitizer. The x-axis denotes the wavelength (unit: nm) and the y-axis denotes light transmissivity (unit: %).

With reference to FIG. 1, light transmissivity is reduced at a short wavelength of 248 nm or less by geometric progression. Since the known non-chemically amplified resist has poor light transmissivity at a short wavelength of 248 nm or less, it is unsuitable for using at a short wavelength of 248 nm or less.

Therefore, in the case of the g-line and i-line photoresists that are used as the known non-chemically amplified resist, it is difficult to form semiconductor micropatterns during KrF (248 nm) semiconductor exposure that is mainly used in the current industrial field because of high absorbance and low sensitivity. Thus, in the current industrial field, the g-line and i-line photoresists are not used for the exposure at a short wavelength of KrF or less.

Accordingly, the demand for a novolac-based resin having high light transmissivity at a short wavelength of 248 nm or less is growing.

Meanwhile, a chemically amplified photoresist containing a photoacid generator is used for the exposure at a short wavelength of KrF or less. The chemically amplified resist contains main components of a PHS polymer and a photoacid generator, and a reaction prohibitor to improve contrast and control solubility. In respects to the development of photoresist material, chemical amplification has been introduced as new concept, in views of chemical mechanism and its use in resists. Chemical amplification means that active species generated by one photon are subjected to chemical chain-reaction to significantly increase the quantum yield. In chemical amplification, the active species that are generated by a single photochemical reaction function as a catalyst to continuously incur chemical reactions such as deprotection and crosslinking. Thus, the total quantum yield of the above-mentioned reactions is significantly increased as compared to the quantum yield when the catalyst is produced at an early stage.

When the chemically amplified resist is used, an acid that is generated by a photoacid generator in a exposed portion is diffused by post exposure bake. In this connection, the solubility of the exposed portion to an alkali developing solution is changed by the reaction using the acid as the catalyst to form positive-type or negative-type patterns. Meanwhile, since the chemically amplified resist contains the acid used as the catalyst, if a substrate has a basic property, tailing occurs at a lower portion of a profile due to deactivation of the acid.

The above-mentioned problems can be avoided by adding a great amount of base-removing substance. However, if a great amount of base-removing substance is used, the sensitivity is reduced. When an excimer laser is used as a light source for exposure, a substrate having low reflectivity is used to significantly improve dimensional uniformity. However, the resist pattern has a tapered profile. Accordingly, the chemically amplified resist is problematic in that its performance and profile depend on the type of substrate.

Among positive type chemically amplified resists, the positive type resist for KrF excimer laser photolithography is made of a poly(hydroxystyrene) resin. Generally, the positive type resist for KrF excimer laser photolithography includes a resin that is protected by a part of phenolic hydroxy groups dissociated by the acid in conjunction with a photoacid generator. In the resolution or sensitivity, the groups which are dissociated by the acid form acetal bonds along with oxygen atoms resulting from the phenolic hydroxy groups. In this connection, a resin that includes tetrahydro-2-pyranyl, tetrahydro-2-furyl, or 1-ethoxy ethyl bonded with oxygen atoms is noticed. However, when the resin is used in metal and implant processes, there is a problem in that a profile is undesirable because the film is thick and the pattern is formed under a special substrate condition.

Generally, an HF etching process is performed during a semiconductor process. However, in the case of the chemically amplified PHS photoresist, the HF etching process cannot be used because of low resistance thereof.

DISCLOSURE OF INVENTION

Technical Problem

Therefore, there is a need to develop a non-chemically amplified photoresist that can be used during a semiconductor process using a short wavelength of KrF or less.

Technical Solution

The present invention has been finalized in order to solve the above-described problems, and an object of the present invention is to provide a non-chemically amplified resist having excellent resistance to HF etching. Another object of the present invention is to provide a photoresist which has desirable physical properties such as sensitivity, resolution, residual film ratio, and coating property and forms a pattern having the desirable profile and depth of focus due to excellent light transmissivity during a semiconductor process and a flat panel display process using a short wavelength of KrF or less.

In order to accomplish the above objects, the present invention provides a photoresist composition which contains a novolac-based resin A, a photosensitizer B, and a low molecular substance C having low absorbance. The low molecular substance having low absorbance has absorbance that is lower than absorbance of the novolac-based resin at one or more wavelengths of 248 nm, 193 nm, and 157 nm, and the photoresist composition is used at the wavelength of 248 nm or less.

The photoresist composition comprises 100 parts by weight of the novolac-based resin A, 30 to 60 parts by weight of the photosensitizer B, and 10 to 30 parts by weight of the low molecular substance C having low absorbance.

The low molecular substance C having low absorbance comprises a compound represented by Formula 1:

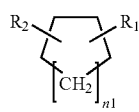

<Formula 1> wherein $R_1$ and $R_2$ are each independently hydrogen, hydroxy, or an alkyl group having 1 to 10 carbon atoms, and $n_1$ is a natural number in the range of 1 to 5.

The photoresist composition further comprises at least one resin D having low absorbance, selected from the group of a novolac-based resin which has low absorbance and at least one of the structural units of Formulae 2 and 3, and a polyhydroxystyrene-based resin which has low absorbance and a structural unit of Formula 4:

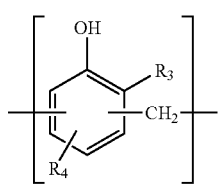

<Formula 2> wherein $R^3$ is an alkyl or alkoxy group having 1 to 15 carbon atoms, ester, ether, carbonyl, acetal, or alcohol group, and $R^4$ is hydrogen or an alkyl group having 1 to 5 carbon atoms,

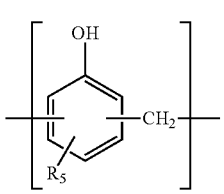

<Formula 3> wherein $R^5$ is an alkyl group having 1 to 5 carbon atoms,

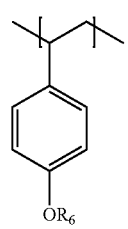

<Formula 4> wherein $R^6$ is hydrogen or an alkyl group having 1 to 15 carbon atoms.

The photoresist composition comprises the resin D having low absorbance in an amount of 5 to 50 parts by weight based on 100 parts by weight of the base resin.

When the photoresist composition is diluted with methanol to have a concentration of $4 \times 10^{-5}$% and the absorbance is measured by using a UV-Vis spectroscope, light transmissivity at a wavelength of 248 nm is increased by 10 to 35% as compared to light transmissivity at a wavelength of 248 nm in the case of when the absorbance of the photoresist composition comprising no low molecular substance having low absorbance is measured by using the UV-Vis spectroscope under the same condition.

The photoresist composition is a non-chemically amplified photoresist.

Furthermore, the present invention provides a patterning method of a photoresist composition. The method includes applying the photoresist composition; exposing a portion of a photoresist composition layer to light having a main wavelength of 248 nm or less; and removing an exposed portion or a non-exposed portion of the photoresist composition layer.

Advantageous Effects

The resist composition of the present invention has the desirable physical properties such as sensitivity, resolution, residual film ratio, and coating property and forms a pattern having the desirable profile and depth of focus during a semiconductor process and a flat panel display process using a short wavelength of 248 nm (KrF) or less, even though the resist composition is applied to a non-chemically amplified resist.

BRIEF DESCRIPTION OF THE DRAWINGS

The above and other features and advantages of the present invention will become more apparent by describing in detail preferred embodiments thereof with reference to the attached drawings in which:

FIG. 1 is a graph illustrating absorbance of a known novolac-based photoresist composition;

FIGS. 2 and 3 are graphs illustrating light transmissivity at 248 nm and 193 nm in Examples according to the present invention;

FIGS. 4A to 4E are SEM pictures illustrating patterns of photoresist compositions of Comparative Example 1 and Examples 1 to 4; and FIG. 5 is a graph illustrating sensitivity in Examples according to the present invention.

BEST MODE FOR CARRYING OUT THE INVENTION

Hereinafter, a detailed description will be given of the present invention.

A photoresist composition according to the present invention contains a novolac-based resin, a photosensitizer, and a low molecular substance having low absorbance. The low molecular substance having low absorbance has an absorbance that is lower than that of the novolac-based resin at one or more wavelengths of 248 nm, 193 nm, and 157 nm. The composition is used at a wavelength of 248 nm or less.

In order to satisfy physical properties of a resist that are required to reduce the concentration of species absorbing light, the resist composition according to the present invention contains the low molecular substance having low absorbance, which has an absorbance that is lower than that of the novolac-based resin at one or more wavelengths of 248 nm, 193 nm, and 157 nm, as an essential component.

(A) Novolac-Based Resin

The novolac-based resin A is a base resin of the photoresist in the related art, and a typical novolac based resin may be used in the present invention. In respects to a process of producing the novolac-based resin A, a phenol compound and aldehyde may be subjected to condensation in the presence of an acid catalyst to produce the novolac-based resin A.

Examples of the phenol compound include phenol, o-, m-, or p-cresol, 2,3-, 2,5-, 3,4-, or 3,5-xylenol, 2,3,5-trimethylphenol, 2-, 3-, or 4-ternary-butylphenol, 2-ternary-butyl-4- or 5-methylphenol, 2-, 4-, or 5-methylresorcinol, 2-, 3-, or 4-methoxyphenol, 2,3-, 2,5-, or 3,5-dimethoxyphenol, 2-methoxyresorcinol, 4-ternary-butylcatechol, 2-, 3-, or 4-ethylphenol, 2,5- or 3,5-diethylphenol, 2,3,5-triethylphenol, 2-naphthol, 1,3-, 1,5-, or 1,7-dihydroxyl naphthalene, and a polyhydroxytriphenylmethane compound that is obtained by condensation of xylenol and hydroxybenzaldehyde. The phenol compounds may be used alone or as a mixture of two or more species.

Examples of aldehyde include aliphatic aldehydes such as formaldehyde, acetoaldehyde, propionaldehyde, n-butylaldehyde, isobutylaldehyde, pivalaldehyde, n-hexylaldehyde, and acroleinaldehyde and crotonaldehyde; alicyclic compounds such as cyclohexyaldehyde, cyclopentanealdehyde, furfural and furyl acrolein; aromatic aldehydes such as benzaldehyde, o-, m-, or p-methylbenzaldehyde, p-ethylbenzaldehyde, 2,4-, 2,5-, 3,4-, or 3,5-dimethylbenzaldehyde, o-, m-, or p-hydroxybenzaldehyde, o-, m-, or p-anisaldehyde, and vanillin; and aromatic aliphatic aldehydes such as phenyl acetaldehyde and cinnamaldehyde.

Aldehydes may be used alone or as a mixture of two or more species. It is preferable to use formaldehyde that can be easily purchased.

Examples of acid catalysts that can be used to perform condensation of a phenol compound and aldehyde include inorganic acid such as hydrochloric acid, sulfuric acid, perchloric acid, and phosphoric acid; organic acid such as formic acid, acetic acid, oxalic acid, trichloroacetic acid, and p-toluenesulfonic acid; and divalent metal salts such as zinc acetate, zinc chloride, and manganese acetate.

The acid catalysts may be used alone or as a mixture of two or more species.

The condensation reaction may be performed, for example, at a temperature in the range of 60 to 120° C. for 2 to 30 hours, according to a typical process.

(B) Photosensitizer

Examples of the photosensitizer B include a photosensitizer that is typically used in the resist field. Particularly, a quinone diazo type radiation-photosensitizer may be used, and examples thereof include diazonaphthoquinone.

Furthermore, o-quinone diazosulfonic acid ester of a compound having one or more phenolic hydroxyl groups may be used. It is preferable to use 1,2-naphthoquinone diazo-5- or 4-sulfonic acid ester or 1,2-benzoquinone diazo-4-sulfonic acid ester of a polyhydroxy compound having three or more phenolic hydroxyl groups. The compounds having the hydroxyl groups and o-quinone diazosulfonic acid halides may be reacted with each other in the presence of a base such as triethylamine to produce the above-mentioned esters. Among o-quinone diazosulfonic acid halides, it is preferable to use 1,2-naphthoquinone diazo-5-sulfonic acid chloride.

The quinone diazo type radiation-photosensitizers may be used alone or as a mixture of one or two agents.

The amount of photosensitizer B is not limited, but it is preferable that the amount be 30 to 60 parts by weight based on 100 parts by weight of novolac-based resin A. When the photosensitizer B is contained in the amount of 30 to 60 parts by weight, a developing speed is desirably maintained during exposure, thus forming required patterns.

The present invention is useful to obtain a non-chemically amplified photoresist that does not contain a photoacid generator by adding the photosensitizer B thereto. Thus, disadvantages of a chemically amplified photoresist can be avoided. However, the addition of the photoacid generator is not excluded in the present invention.

(C) Low Molecular Substance having Low Absorbance

Preferable examples of the low molecular substance C having low absorbance include a compound represented by the following Formula 1.

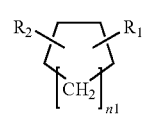

<Formula 1> wherein $R_1$ and $R_2$ are independently hydrogen, hydroxy, or an alkyl group having 1 to 10 carbon atoms, and $n_1$ is a natural number in the range of 1 to 5.

When $R_1$ and $R_2$ of the low molecular substance C having low absorbance are hydrogen, hydroxy, or an alkyl group having 1 to 10 carbon atoms, light transmissivity and sensitivity of the photoresist containing the low molecular substance C having low absorbance are increased, thus ensuring desirable patterns.

When $n_1$ is in the range of 1 to 5, the light transmissivity and sensitivity are increased, thus ensuring desirable patterns. If $n_1$ is more than 5, the transmissivity is reduced due to absorption of light. Therefore, it is difficult to obtain effects of the low molecular substance C having low absorbance.

The low molecular substance C having low absorbance is a low molecular compound that has lower absorbance at one or more wavelengths of 248 nm, 193 nm, and 157 nm as compared to the novolac-based resin A. Any low molecular compound may be used in the present invention as long as the compound satisfies the above-mentioned absorbance characteristic. The low molecular substance contains oligomers, not polymers.

The amount of low molecular substance C having low absorbance is not limited, but it is preferable that the amount be 10 to 30 parts by weight based on 100 parts by weight of novolac-based resin A. When the low molecular substance is contained in the amount of 10 to 30 parts by weight, physical properties of the photoresist are desirable, thus preventing damage to the patterns during development.

(D) Resin having Low Absorbance

The composition of the present invention contains a resin D that has lower absorbance at one or more wavelengths of 248 nm, 193 nm, and 157 nm as compared to the novolac-based resin A, in addition to the low molecular substance C having low absorbance.

When the resin D having low absorbance is added to the resist composition, it is preferable to select the resin having low absorbance that can satisfy physical properties required from the resist composition. In particular, the resin D having low absorbance preferably has a main frame of the polyhydroxystyrene-based resin or novolac-based resin to improve physical properties of the resist. Furthermore, the resin D preferably includes a functional group or side branch having desirable transmissivity at a relatively short wavelength. The polyhydroxystyrene-based resin that does not have reactivity to the photosensitizer may be used as the polyhydroxystyrene-based resin having low absorbance. However, it is preferable to use acetal, adamantyl, and a hybrid type polyhydroxystyrene-based resin that have predetermined reactivity to the photosensitizer in the view of improvement of contrast.

Examples of the resin D having low absorbance are selected from the group of a novolac-based resin which has low absorbance and at least one of the structural units of Formulae 2 and 3, and a polyhydroxystyrene-based resin which has low absorbance and a structural unit of Formula 4. The resist composition may contain at least one of the resins D having low absorbance.

<Formula 2>

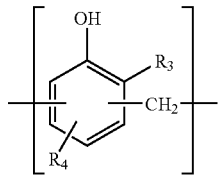

wherein $R^3$ is any one of alkyl or alkoxy group having 1 to 15 carbon atoms, ester, ether, carbonyl, acetal, and alcohol group, and $R^4$ is hydrogen or an alkyl group having 1 to 5 carbon atoms.

<Formula 3>

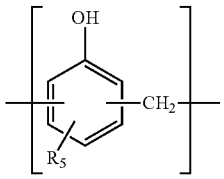

wherein $R^5$ is an alkyl group having 1 to 5 carbon atoms.

<Formula 4>

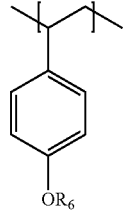

wherein $R^6$ is hydrogen or an alkyl group having 1 to 15 carbon atoms.

In Formula 2, when $R^3$ is any one of alkyl or alkoxy group having 1 to 15 carbon atoms, ester, ether, carbonyl, acetal, and alcohol group and $R^4$ is hydrogen or an alkyl group having 1 to 5 carbon atoms, the light transmissivity and sensitivity are increased, thus ensuring desirable patterns.

In Formula 3, when $R^5$ is an alkyl group having 1 to 5 carbon atoms, the light transmissivity and sensitivity are increased, thus ensuring desirable patterns.

In Formula 4, when $R^6$ is hydrogen or an alkyl group having 1 to 15 carbon atoms, the light transmissivity and sensitivity are increased, thus ensuring desirable patterns.

If species of the photoresist composition, which absorb light, are treated twice or three times by using the novolac-based resin having low absorbance and/or polyhydroxystyrene-based resin having low absorbance, which have the excellent light transmissivity, so that the concentrations of the species are reduced, the light transmissivity and sensitivity are increased. In the present invention, the resins that have low absorbance D and different structural units may be copolymerized.

The amount of resin D having low absorbance is not limited, but it is preferable that the amount be 5 to 50 parts by weight based on 100 parts by weight of novolac-based resin A. When the resin D is contained in the amount of 5 to 50 parts by weight, the reactivity between the novolac-based resin and the photosensitizer is desirable, thus preventing damage to patterns during development.

The weight average molecular weight of resin D having low absorbance is not limited, but it is preferable that the weight average molecular weight be in the range of 3,000 to 20,000 (based on polystyrene), which is obtained by using a gel permeation chromatography (GPC) method. When the weight average molecular weight is in the range of 3,000 to 20,000, the light transmissivity is desirable, accordingly, the resin reacts with a KrF exposure source to form patterns even though A photoresist containing the resin D according to the present invention is a non-chemically amplified resist.

The low molecular substance C having low absorbance and the resin D having low absorbance may be optionally added to the resist to reduce the concentration of the novolac-based resin A, thus improving the light transmissivity at a wavelength of 248 nm (KrF) or less. Thereby, micropatterns can be formed at a short wavelength and physical properties of the resist can be desirably satisfied. Furthermore, the sensitivity can be improved.

The photoresist composition according to the present invention may further contain components that are known in the related art. In particular, the components that are known to be added to the novolac-based photoresist composition may be used in the present invention.

For example, a solvent may be further contained in order to easily perform coating. The photoresist composition according to the present invention is applied on a substrate such as a silicon wafer as a resist solution. In detail, the above-mentioned components are dissolved in the solvent to produce the resist solution and the resist solution thusly produced is applied on the substrate. Any solvent may be used as long as the solvent can dissolve the components, be dried at a predetermined rate, and be used to form a uniform and smooth coating layer. That is, the typical solvent may be used. Examples of the solvents include glycol ether esters such as ethyl cellosolve acetate, methyl cellosolve acetate, propylene glycol monomethyl ether acetate, and propylene glycol monoethyl ether acetate; glycol ethers such as ethyl cellosolve, methyl cellosolve, propylene glycol monomethyl ether, and propylene glycol monoethyl ether; esters such as ethyl lactate, butyl acetate, amyl acetate, and ethyl pyruvate; ketones such as 2-heptanone and cyclohexanone; and cyclic esters such as g-butyrolactone. The solvents may be used alone or as a mixture of two or more species.

The photoresist composition according to the present invention contains the resin having low absorbance to increase the light transmissivity at a wavelength of 248 nm by 10 to 35% as compared to the case of when the absorbance is measured by using a UV-Vis spectroscope. Furthermore, even though the resin having low absorbance is added, desirable physical properties of the photoresist composition can be ensured.

In addition, the present invention provides a method of forming a pattern of the photoresist composition. The method of forming the pattern of the photoresist composition according to the present invention includes applying the photoresist composition, exposing a portion of the photoresist composition layer to light having a wavelength of 248 nm or less, and removing an exposed portion or a non-exposed portion of the photoresist composition layer.

The application of the composition on a substrate, and photocuring and development of the resulting substrate to form the pattern will be described below.

First, the composition is applied on a base substrate (illustrating, but non-limiting examples of the base substrate include glass or a silicon wafer) or the resist composition layer containing solids and subjected to predrying to remove a volatile component such as a solvent, thus forming a flat coating film. The thickness of the coating film is not limited, but preferably in the range of 1 to 3 mm. The base substrate may be a silicon wafer which is treated with hexamethyldisilazane and includes TiN deposited thereon. In addition, the process of applying the photoresist is not limited, but may be simply performed by using a spin coater. After the application, drying and then a prebake are performed on a hot plate at 100° C. for 60 sec.

In order to form a required pattern on the coating film thusly formed, a predetermined portion of the coating film is selectively exposed to light emitted from a light source at an exposure wavelength of 248 nm or less by using a mask. In connection with this, parallel rays are uniformly radiated on the entire exposed portion and a mask aligner or a stepper is used so as to precisely align the mask with the substrate.

The type of light source at the exposure wavelength of 248 nm or less is not limited, but may be at least one selected from KrF (248 nm), ArF (193 nm), $F_2$ (157 nm), and EUV (65 nm).

For example, exposure is performed by using a scan type exposing device of 248 nm (KrF) [trade name: NSR-S203B, manufactured by Nikon Corp., NA=0.55, s=0.75] while an exposure dose is slowly changed to form line and space patterns.

Next, the development is performed by using an alkali developing solution. The prebake may be performed on the hot plate at 100° C. for 60 sec before the development, if necessary. Various types of alkali solutions known in the related art may be used as the alkali developing solution. In general, tetramethylammonium hydroxide and (2-hydroxyethyl)trimethylammonium hydroxide (another name: Choline) are used in an aqueous solution form. After the development, a post exposure bake may be performed at a temperature in the range of 150 to 230° C. for 10 to 60 min if necessary.

After the development, 0.4 mm line and space patterns were analyzed by using a scanning electron microscope in terms of depth of focus and profile, and the depth of focus, the profile, and the sensitivity of the resist composition pattern according to the present invention were evaluated to be desirable.

Mode for the Invention

A better understanding of the present invention may be obtained in light of the following Examples which are set forth to illustrate, but are not to be construed to limit the present invention.

EXAMPLES 1 TO 4 AND COMPARATIVE EXAMPLES 1 AND 2

Preparation of a Photoresist Composition

The compositions were mixed according to the composition ratio described in Table 1 to prepare the photoresist composition.

TABLE 1

| | Resin (part by weight) | | Photosensitizer (part by weight) | | Low molecular substance having low absorbance (part by weight) | | Resin having low absorbance (part by weight) | | Photoacid generator (part by weight) | |
|---|---|---|---|---|---|---|---|---|---|---|
| Example 1 | a-1 | 100 | b-1 | 42 | c-1 | 5 | x | x | x | x |
| Example 2 | a-1 | 100 | b-1 | 42 | c-1 | 10 | x | x | x | x |
| Example 3 | a-1 | 100 | b-1 | 42 | c-1 | 15 | x | x | x | x |
| Example 4 | a-1 | 100 | b-1 | 42 | c-1 | 10 | d-1 | 15 | x | x |
| Comparative Example 1 | a-1 | 100 | b-1 | 75 | x | x | x | x | x | x |
| Comparative Example 2 | a-2 | 100 | x | x | x | x | x | x | e-1 | x | a-1: m/p cresol novolac-based resin (manufactured by Sumitomo Chemical, Co., Ltd.)
a-2: polyhydroxystyrene-based resin (manufactured by Sumitomo Chemical, Co., Ltd.)
b-1: diazonaphthoquinone type photosensitizer (manufactured by Sumitomo Chemical, Co., Ltd.)
c-1: 1,4-cyclohexanediol (manufactured by Sigma-Aldrich, Corp.)
d-1: resin having low absorbance, which is represented by Formula 4 and in which $R_6$ is hydrogen
e-1: diazo type photoacid generator (manufactured by Wako, Corp.)

EXPERIMENTAL EXAMPLE 1

Evaluation of Absorbance

After the photoresist compositions of Comparative Example 1 and Examples 1 to 4 were diluted with methanol to have a concentration of 4>10⁻⁵%, light transmissivities thereof were measured by using a UV-Visible spectroscope, and the results are shown in FIGS. 2 and 3. The x axes of FIGS. 2 and 3 denote the wavelength (unit: nm) and the y axes denote the light transmissivity (unit: %).

With reference to FIG. 2, light transmissivity of the novolac-based photoresist composition of Comparative Example 1 was 15.87% at a wavelength of 248 nm. In Examples 1 to 4, the light transmissivities were 28.49%, 31.79%, 34.99%, and 35.72%. Therefore, it can be seen that the transmissivity was increased by 179.52%, 200.31%, 220.47%, and 225.07% in Examples 1 to 4 as compared to Comparative Example 1.

With reference to FIG. 3, the light transmissivity of the novolac-based photoresist composition of Comparative Example 1 was 14.82% at a wavelength of 193 nm. In Examples 1 to 4, the light transmissivities were 18.1%, 19.35%, 20.9%, and 21.25%. Therefore, it can be seen that the light transmissivity was increased by 149.32%, 206.2%, 276.85%, and 292.78% in Examples 1 to 4 as compared to Comparative Example 1.

EXPERIMENTAL EXAMPLE 2

Formation of the Pattern

The photoresist compositions of Comparative Example 1 and Examples 1 to 4 were each applied on a substrate, which was obtained by treating a 6 silicon wafer with hexamethyldisilazane (HMDS), by means of a spin coater. The resulting substrate was dried on a hot plate by pre-baking at 100° C. for 60 sec to form a resist layer having a thickness of 350 nm.

The wafer having the resist film was exposed by using a scan type exposing device [trade name: NSR-S203B, manufactured by Nikon Corp., NA=0.55, s=0.75] having an exposure wavelength of 248 nm (KrF) while an exposure dose was slowly changed to form line and space patterns.

Next, the resulting film was exposed on the hot plate and subjected to post-exposure bake (PEB) at 90° C. for 60 sec. Paddle development was performed for 60 sec by using 2.38% tetramethylammonium hydroxide (TMAH) aqueous solution. Subsequently, rinsing was performed by using pure water to form a 0.4 mm line and space (1:1) pattern.

The patterns of Comparative Example 1 and Examples 1 to 4 were observed by using a SEM (scanning electron microscope), and the results are shown in FIGS. 4A to 4E.

As shown in FIGS. 4B to 4E, a rectangular pattern having a line width of 0.4 mm was formed without filling the spaces or destroying the lines in the Examples. Furthermore, in Examples 1 to 4, patterns having a good appearance were formed due to high transmissivity, and when the amount of resin having low absorbance was increased. However, with reference to FIG. 4A, if the novolac-based photoresist of Comparative Example 1 was exposed by using the light source of KrF (248 nm), it was difficult to form a desirable pattern due to low transmissivity.

EXPERIMENTAL EXAMPLE 3

Evaluation of Sensitivity

The patterns were formed by using the photoresist compositions of Comparative Example 1 and Examples according to the above-mentioned procedure. Exposure energy was changed to obtain minimum exposure energy when the pattern was formed on the bottom of the photoresist film, and the sensitivity was then measured. The results are shown in FIG. 5. The x-axis denotes the sensitivity (unit: mJ/cm²), and the y-axis denotes Comparative Example 1 and Examples 1 to 4.

As shown in FIG. 5, the minimum exposure energy of the photoresist of Comparative Example 1 was 200 mJ/cm². However, in the case of the photoresists of Examples 1 to 4, the sensitivities were improved to 49 mJ/cm², 36 mJ/cm², 34 mJ/cm², and 31 mJ/cm².

EXPERIMENTAL EXAMPLE 4

HF Wet Etching

The patterns were formed on the silicon wafer on which the silicon oxide film was deposited by using the photoresist compositions of Example 4 and Comparative Example 2 according to the above-mentioned procedure. The resulting wafer was dipped in BOE etchant (0.5 parts by weight of 50% hydrofluoric acid based on 100 parts by weight of 40% ammonium fluoride) at 23° C. for 440 sec.

After rinsing was performed by using pure water for 60 sec, drying was performed using nitrogen and the pattern was observed by using a SEM (scanning electron microscope). From the observation, it could be seen that the pattern of Comparative Example 2 was entirely etched but the pattern having the line width of 0.4 mm of Example 4 was not destroyed.

The invention claimed is:

1. A photoresist composition which comprises a novolac-based resin A, a photosensitizer B, and a low molecular substance C having a low absorbance, wherein the low molecular substance C having low absorbance, which is represented by the following Formula 1, has absorbance that is lower than absorbance of the novolac-based resin at one or more wavelengths of 248 nm, 193 nm and 157 nm, and the photoresist composition is used at the wavelength of 248 nm or less

Formula 1 wherein $R_1$ and $R_2$ are hydroxy and $n_1$ is a natural number in the range of 1 to 5.

2. The photoresist composition according to claim 1, wherein the photoresist composition comprises 100 parts by weight of the novolac-based resin A, 30 to 60 parts by weight of the photosensitizer B, and 10 to 30 parts by weight of the low molecular substance C having low absorbance.

3. The photoresist composition according to claim 1, wherein the photoresist composition comprises at least one resin D having low absorbance, selected from the group of a novolac-based resin Which has low absorbance and at least one of the structural units of Formulae 2 and 3, and a polyhydroxystyrene-based resin which has low absorbance and a structural unit of Formula 4:

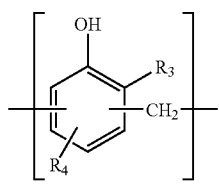

Formula 2 wherein $R^3$ is an alkyl or alkoxy group having 1 to 15 carbon atoms, ester, ether, carbonyl, acetal, or alcohol group, and $R^4$ is hydrogen or an alkyl group having 1 to 5 carbon atoms,

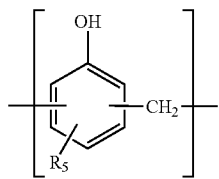

Formula 3 wherein $R^5$ is an alkyl group having 1 to 5 carbon atoms,

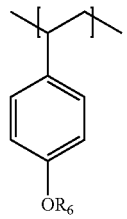

Formula 4 wherein $R^6$ is hydrogen or an alkyl group having 1 to 15 carbon atoms.

4. The photoresst composition according to claim 3, wherein the photoresist composition comprises the resin D having low absorbance in an amount of 5 to 50 parts by weight based on 100 parts by weight of the base resin.

5. The photoresist composition according to claim 1, wherein the photoresist composition is a non-chemically amplified photoresist.

6. A patterning method of a photoresist composition, comprising:
    applying the photoresist composition of claim 1;
    exposing a portion of a photoresist composition layer to light having a main wavelength of 248 nm or less; and
    removing an exposed portion or a non-exposed portion of the photoresist composition layer.

* * * * *